United States Patent
Tsutsui et al.

(10) Patent No.: US 7,844,939 B2
(45) Date of Patent: Nov. 30, 2010

(54) MASK PATTERN CORRECTION PROGRAM AND SYSTEM

(75) Inventors: Reiko Tsutsui, Kanagawa (JP); Hidetoshi Oishi, Kanagawa (JP)

(73) Assignee: Sony Corporation, Tokyo (JP)

(*) Notice: Subject to any disclaimer, the term of this patent is extended or adjusted under 35 U.S.C. 154(b) by 429 days.

(21) Appl. No.: 11/939,223

(22) Filed: Nov. 13, 2007

(65) Prior Publication Data

US 2008/0120589 A1 May 22, 2008

(30) Foreign Application Priority Data

Nov. 17, 2006 (JP) .............................. 2006-311111

(51) Int. Cl.
- G06F 17/50 (2006.01)
- G06F 19/00 (2006.01)
- G03F 5/00 (2006.01)
- G21K 1/00 (2006.01)
- G06K 9/00 (2006.01)

(52) U.S. Cl. ........................... 716/21; 700/97; 700/120; 700/121; 430/5; 378/35; 382/144; 382/154

(58) Field of Classification Search .................. 716/21; 700/97, 120, 121; 430/5; 378/35; 382/144, 382/154

See application file for complete search history.

(56) References Cited

U.S. PATENT DOCUMENTS 7,035,446 B2 * 4/2006 Medvedeva et al. ......... 382/144
2003/0219154 A1 * 11/2003 Medvedeva et al. ......... 382/144
2005/0050512 A1 * 3/2005 Kochan et al. ................ 716/21
2007/0157152 A1 * 7/2007 Strelkova et al. ............. 716/21
2008/0216040 A1 * 9/2008 Furnish et al. ................ 716/10

FOREIGN PATENT DOCUMENTS

| JP | 10-083064 | 3/1998 |
|---|---|---|
| JP | 10-104818 | 4/1998 |
| JP | 2000-098584 | 4/2000 |
| JP | 2001-188336 | 7/2001 |
| JP | 2002-062633 | 2/2002 |
| JP | 2005-055563 | 3/2005 |

* cited by examiner

Primary Examiner—Phallaka Kik
(74) Attorney, Agent, or Firm—SNR Denton US LLP

(57) ABSTRACT

The present invention provides a mask pattern correction program for correcting a design pattern which serves as a source to form a mask pattern so that, by exposure of a mask with a pattern formed thereon onto a substrate, the mask pattern is transferred as designed, the mask pattern correction program including performing, on a computer, the steps of: determining, before simulation of the dimension of the pattern transferred by exposure, whether the simulation result will converge; and classifying design pattern edges into first and second target edges, correct the first target edges and perform simulation thereon if it is determined that the simulation result will not converge.

6 Claims, 8 Drawing Sheets

FIG.5A

| CORRECTION COUNT | POST-CORRECTION PATTERN WIDTH [nm] | | EPE ※ [nm] | |
|---|---|---|---|---|
| | X DIRECTION | Y DIRECTION | X DIRECTION | Y DIRECTION |
| 1 | 148.0 | 148.0 | +15.8 | +15.7 |
| 2 | 136.0 | 136.0 | -16.4 | -16.5 |
| 3 | 148.0 | 148.0 | +15.7 | +15.6 |
| 4 | 136.0 | 136.0 | -16.3 | -16.4 |
| 5 | 138.0 | 138.0 | -11.6 | -11.8 |
| 6 | 140.0 | 140.0 | -7.1 | -7.3 |
| 7 | 142.0 | 142.0 | -3.0 | -3.1 |
| 8 | 144.0 | 144.0 | +2.4 | +2.2 |
| 9 | 142.0 | 142.0 | -3.2 | -3.3 |
| 10 | 144.0 | 144.0 | +2.3 | +2.2 |

FIG.5B

| CORRECTION COUNT | POST-CORRECTION PATTERN WIDTH [nm] | | EPE ※ [nm] | |
|---|---|---|---|---|
| | X DIRECTION | Y DIRECTION | X DIRECTION | Y DIRECTION |
| 1 | 148.0 | 148.0 | +15.8 | +15.7 |
| 2 | 136.0 | 136.0 | -16.4 | -16.5 |
| 3 | 148.0 | 148.0 | +15.7 | +15.6 |
| 4 | 136.0 | 136.0 | -16.3 | -16.4 |
| 5 | 138.0 | 138.0 | -11.6 | -11.8 |
| 6 | 140.0 | 140.0 | -7.1 | -7.3 |
| 7 | 142.0 | 142.0 | -3.0 | -3.1 |
| 8 | 143.0 | 143.0 | -0.3 | -0.2 |

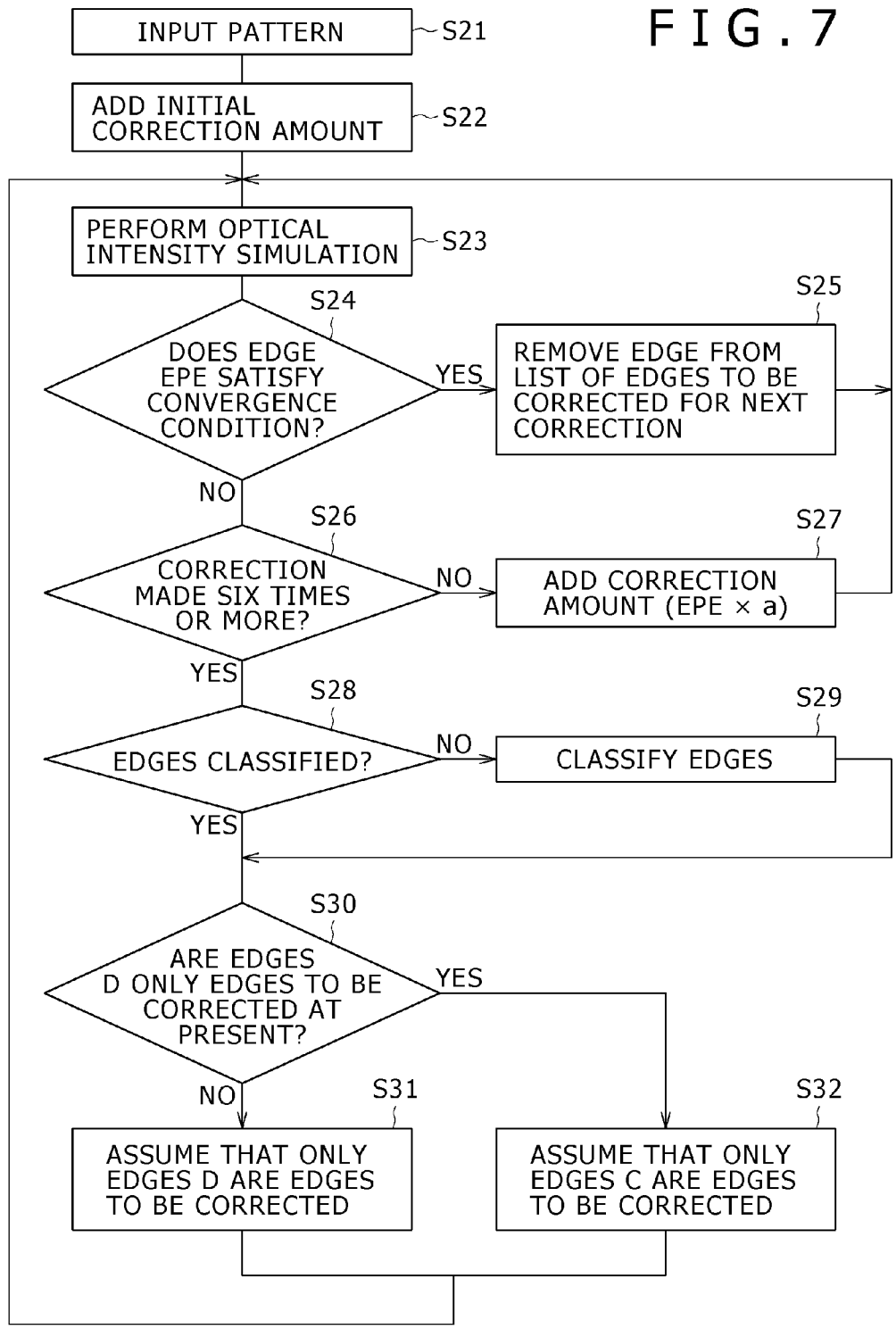

MASK PATTERN CORRECTION PROGRAM AND SYSTEM

CROSS REFERENCES TO RELATED APPLICATIONS

The present invention contains subject matter related to Japanese Patent Application JP 2006-311111 filed in the Japan Patent Office on Nov. 17, 2006, the entire contents of which being incorporated herein by reference.

BACKGROUND OF THE INVENTION

1. Field of the Invention

The present invention relates to a mask pattern correction program and system for correcting, on a computer, a design pattern which serves as a source to form a mask pattern so that, by exposure of a mask with a pattern formed thereon onto a substrate, the mask pattern is transferred as designed.

2. Description of the Related Art

Recent years have seen remarkable progress in semiconductor manufacturing technology, with semiconductors having a smallest patterned dimension of 0.2 µm already in volume production. Such fine size reduction has been made possible by dramatic progress in fine patterning technology including mask process, photolithography and etching technology.

Under these circumstances, when the pattern size was sufficiently large, the two-dimensional shape of a desired LSI pattern to be formed on a wafer was drawn as is as a design pattern. Then, a mask pattern faithfully representing this design pattern was created, followed by transfer of the mask pattern onto a wafer using projection optics. Finally, the underlying layer was etched to create a pattern substantially similar to the design pattern on the wafer.

With increasing reduction in pattern dimension, however, it is becoming difficult to faithfully form a pattern in each process, thus resulting in a dimensional difference between the final finished pattern and the design pattern.

To solve these problems, means (hereinafter referred to as mask data process) are extremely important to prepare a mask pattern different from the design pattern in consideration of a conversion difference in each process so that the final finished dimension is the same as the design pattern dimension.

Here, among examples of the mask data process are MDP adapted to change the pattern using graphical computation and design rule checker (D.R.C) and optical proximity correction (OPC) adapted to correct optical proximity effect.

As a result of recent pattern dimension reduction, however, the OPC based on high-precision model using an optical model is becoming mainstream to make the transition from the OPC (rule-based OPC) using the MDP methodology in the past.

With the model-based OPC, simulation is performed to predict the finished pattern assuming that a given design pattern is the pattern to be formed on the wafer. Correction is made so that the simulation result roughly matches the design pattern (e.g., refer to Japanese Patent Laid-Open No. 2002-62633 and Japanese Patent Laid-Open No. 2000-98584).

SUMMARY OF THE INVENTION

In a design pattern with a fine edge-to-edge spacing, however, there are times when a minimum correction value may lead to a large variation in simulation results (e.g., 3 nm to 10 nm). In this case, the dimensional difference between the simulated shape and the design pattern may be alternately positive and negative, causing non-convergence of the calculations.

Further, correction of an edge whose simulation results vary considerably can significantly affect neighboring edges. Suppose, for example, that an edge A whose simulation results vary considerably is corrected positively. Then, even if an edge B adjacent thereto is corrected negatively, the dimensional difference between the simulated shape and the design pattern increases toward a positive direction as compared to before the negative correction. This may require repeated simulation projections and calculations, thus maybe requiring a large amount of time. Therefore, even for a correctable pattern, the edge position may not be optimized depending on the pattern layout, resulting in an aggravated CD uniformity.

In this regard, a calculation method of the maximum correction amount is proposed in Patent Document 1. With this method, the adjacent pattern is checked for each edge to determine whether it is to be corrected. Then, the maximum correction amount is calculated for each case. However, it is not sufficient to find the maximum correction amount. On the other hand, a method is proposed in Patent Document 2 which prevents fluctuation of the correction amount. This method does so by first calculating an MEEF for each edge and then dividing the displacement per OPC by the MEEF. However, adjacent patterns are not considered in this method.

It should be noted that MEEF stands for Mask Error Enhancement Factor and represents the value obtained by dividing the variation in resist dimension on a wafer by the variation in mask dimension (1× conversion value).

The present invention has been devised to solve the above problem. That is, the present invention performs two steps on a computer with a mask pattern correction program for correcting a design pattern which serves as a source to form a mask pattern so that, by exposure of a mask with a pattern formed thereon onto a substrate, the mask pattern is transferred as designed. One of the steps is to determine, before simulation of the dimension of the pattern transferred by exposure, whether the simulation result will converge. The other step is to classify design pattern edges into first and second target edges, correct the first target edges and perform simulation thereon if it is determined that the simulation result will not converge.

Here, it is determined that the simulation result will not converge if the spacing between each of the edges of the design pattern and the edge of the adjacent pattern or the edge-to-edge spacing in the design pattern is smaller than a given spacing. It is also determined that the simulation result will not converge if the difference between transferred pattern and design pattern does not fall within a given range when correction of the design pattern by a given amount followed by the simulation using the design pattern is repeated a predetermined number of times.

More specifically, the present invention is a mask pattern correction program for correcting a design pattern which serves as a source to form a mask pattern so that a pattern formed on a mask is transferred, as designed, onto a wafer which is a substrate. If the mask pattern is fine and densely packed, or if the difference between transferred pattern and design values does not fall within a given range after a repetition of simulation and design pattern correction, the program classifies design pattern edges into first and second edges, corrects the first edges and performs simulation thereon.

The above process ensures that the design pattern is more elaborately corrected than by ordinary correction, thus allowing simulation calculations to converge in a shorter period of time.

Therefore, the present invention allows for edge correction in a relatively short period of time and with high precision even for a mask pattern whose vertical pattern change may affect the finished horizontal plane shape. Further, the present invention ensures pattern-independent correction of design patterns with excellent convergence.

BRIEF DESCRIPTION OF THE DRAWINGS

FIGS. 5A and 5B are views illustrating an example of simulation calculation results;

FIG. 7 is a flowchart describing the mask pattern correction program according to another embodiment.

DETAILED DESCRIPTION OF THE PREFERRED EMBODIMENTS

Figure 1:
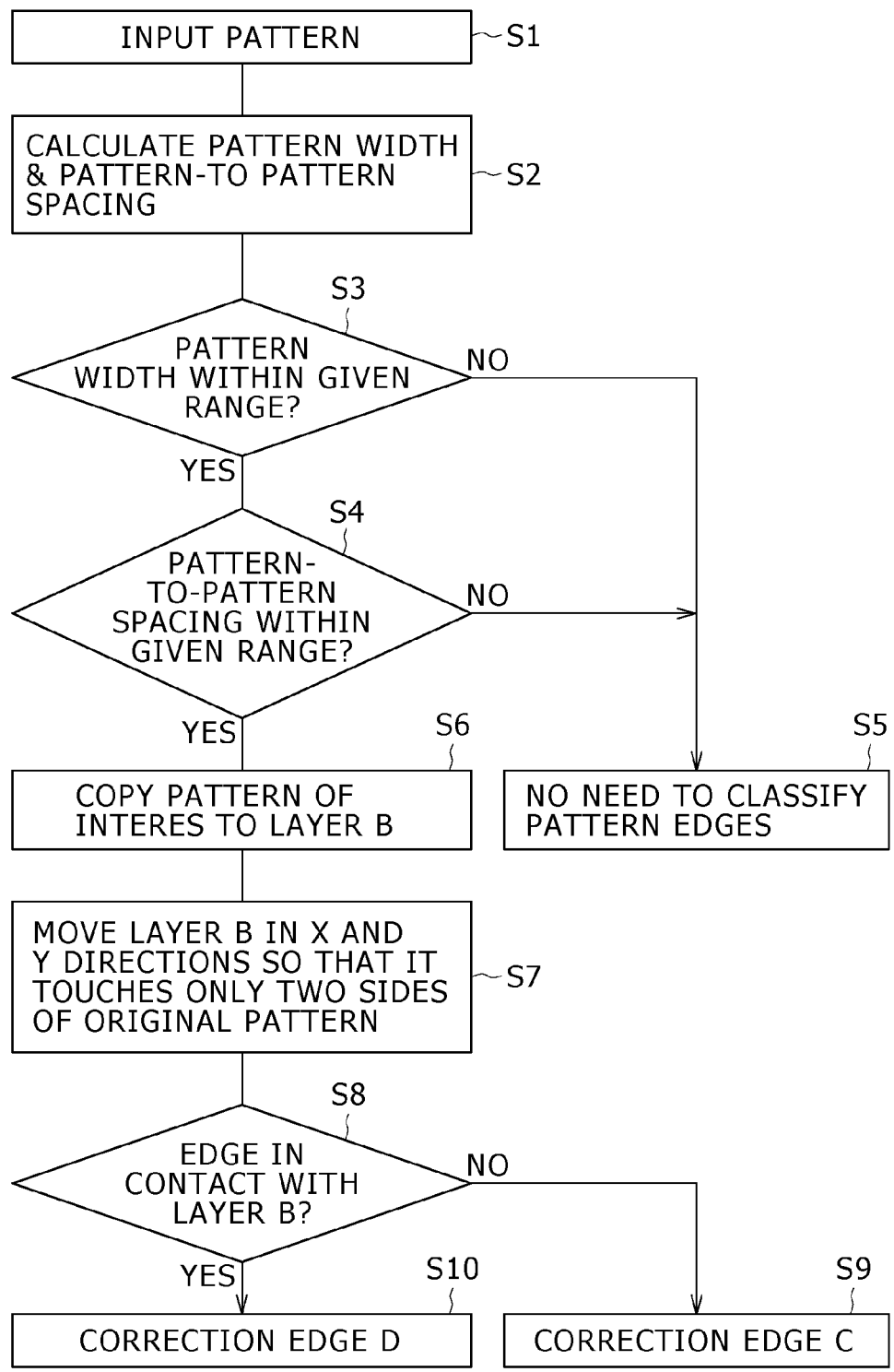
FIG. 1 is a flowchart describing a mask pattern correction program according to a present embodiment.
Figure 2:
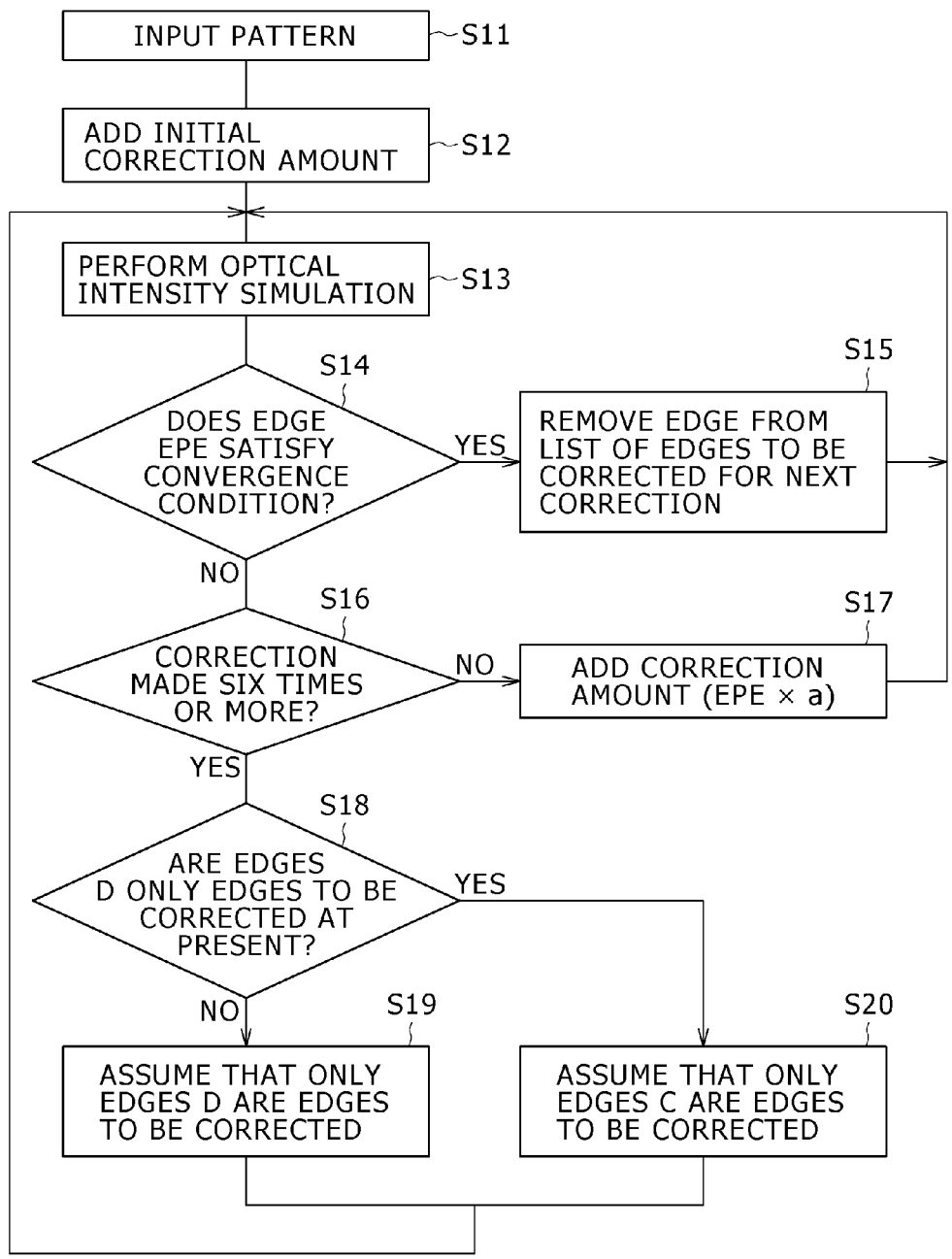
FIG. 2 is another flowchart describing the mask pattern correction program according to the present embodiment.

The preferred embodiments of the present invention will be described below with reference to the accompanying drawings. FIGS. 1 and 2 are flowcharts describing a mask pattern correction program according to a present embodiment. It should be noted that the mask pattern correction program according to the present embodiment is executed by a computer such as a workstation or personal computer. The program can be made available in various forms. It may be installed to storage means of a computer for execution. Alternatively, it may be stored in a CD-ROM or other medium. Still alternatively, it may be delivered via a network. Further, a system may be configured in which the mask pattern correction program of the present invention can be executed by a computer.

First, as illustrated in FIG. 1, target design pattern data is acquired from a database or other source (step S1). Next, the width and pattern-to-pattern spacing of the input design pattern are calculated (step S2). Then, it is determined whether the pattern width falls within a given range (step S3) and whether the pattern-to-pattern spacing falls within a given range (step S4).

Figure 3A:
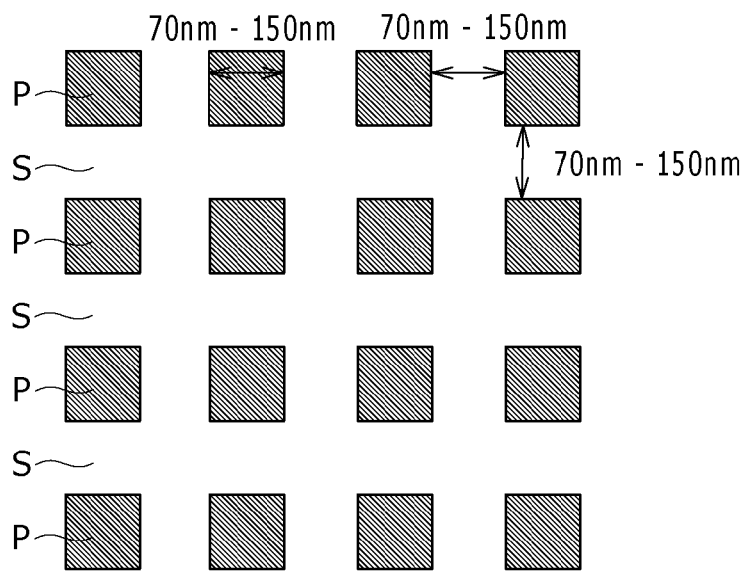
FIGS. 3A and 3B are schematic diagrams describing a pattern adapted to form a contact hole.

In the case of a pattern P adapted to form a contact hole illustrated in FIG. 3A, for example, the pattern P width and a spacing S between the patterns P are measured from input data prior to optical intensity simulation. It is determined whether the contact patterns are densely packed, that is, whether the pattern width falls, for example, within a range of 70 nm to 150 nm, which is a range comparable to the minimum line width, and also whether the edge-to-edge spacing falls within the same range. Then, this pattern is extracted. It should be noted that the conditional values for the pattern width and pattern-to-pattern spacing preferably provide a significant optical proximity effect depending on the exposure and other conditions.

Next, if, as a result of the above determination, the pattern width or pattern-to-pattern spacing falls outside the given range, the pattern edges are not classified assuming that the patterns are not densely packed (step S5). On the other hand, when both the pattern width and pattern-to-pattern spacing fall within the given range, the pattern edges are classified assuming that the patterns are densely packed.

The pattern edges are classified by first copying the pattern of interest to an arbitrary layer (step S6) and then moving the copied pattern slightly in the X and Y directions of the design coordinates so that the copied pattern touches only two sides of the original pattern (step S7).

Then, it is determined whether each of the edges of the pattern of interest touches the pattern copied to an arbitrary layer (step S8). If not, the edge is classified as a correction edge C (step S9). If so, the edge is classified as a correction edge D (step S10).

Figure 3B:
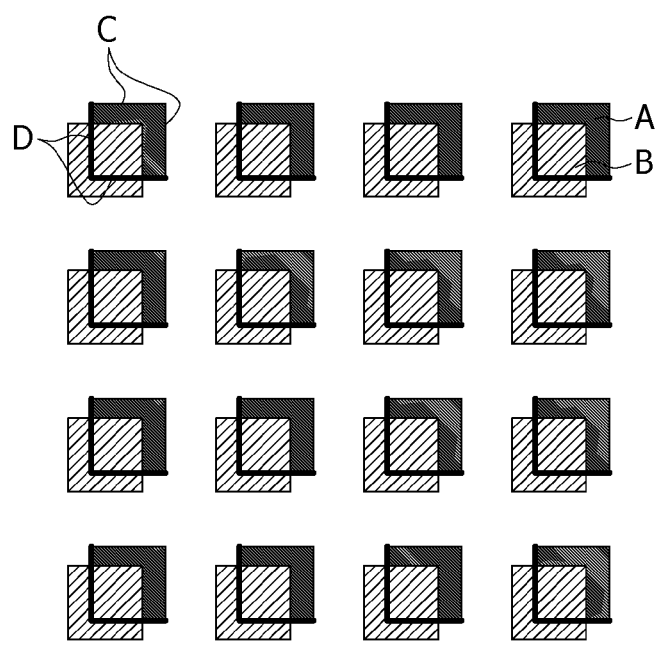

FIG. 3B is a view illustrating the copied pattern P copied to an arbitrary layer in contrast with the pattern P adapted to form a contact hole illustrated in FIG. 3A. The original pattern is arranged on a layer A, and the copied pattern on a layer B. The copied pattern is moved in parallel slightly toward the bottom left in the figure relative to the original pattern.

More specifically, an identically shaped pattern is prepared as the layer B. The X and Y coordinates of the layer B are moved, for example, by 1 nm in a negative direction to such an extent that the layer B does not touch the adjacent pattern, so that the layer B touches only two sides of the layer A.

Then, an edge of the layer A pattern is classified as an edge D if it touches an edge of the layer B pattern. An edge is classified as an edge C if it does not touch any edge of the layer B pattern. Thus, of the four edges of a single pattern, two edges touching the bottom left vertex are classified as the edges D, and others as the edges C.

Next, based on this process, the design pattern is corrected according to the OPC correction flowchart illustrated in FIG. 2.

First, target design pattern data is input from a database or other source (step S11), followed by addition of an initial correction amount (step S12).

The correction amount is calculated by EPE (dimensional difference between the simulated shape and the design pattern)×a where a=−60% for the first correction, a=−40% for the second correction, a=−40% for the third correction, a=−40% for the fourth correction, and a=−10% for the fifth correction and beyond. Further, the design pattern is positively biased by approximately 40% of the minimum line width (e.g., 30 nm) as an initial correction value. It should be noted that these values are merely examples, and the present invention is not limited thereto.

Next, based on the above correction amount, optical intensity simulation is performed (step S13). This simulation produces, as an EPE output, the difference between the calculated dimension of the pattern transferred by exposure under predetermined conditions using a mask with a pattern to be corrected formed thereon and the design pattern dimension.

Then, it is determined whether the EPE of the target pattern edge satisfies the convergence condition (step S14). If so, the correction is assumed to be complete, and the edge is removed from the list of edges to be corrected for the next correction (step S15).

If not, it is determined whether the correction has been made a predetermined number of times (6 times in this case) or more (step S16). If not, the above correction amount is added to the edge (step S17). The correction amount is EPE×a as described above, with 'a' being a ratio set for each number of corrections performed.

If the EPE of the target pattern edge does not satisfy the convergence condition, the correction and optical intensity simulation are repeated. If, after a predetermined number of corrections, the EPE fails to satisfy the convergence condition, it is determined whether the edges D are the only edges to be corrected at present (step S18).

If the edges to be corrected include not only edges D, it is assumed that the edges D are the only edges to be corrected (step S19). Then, the correction amount is added only to the edges D, followed by optical intensity simulation.

On the other hand, when the edges to be corrected include only edges D, it is assumed that the edges C are the only edges to be corrected (step S20). Then, the correction amount is added only to the edges C, followed by optical intensity simulation.

That is, if convergence is not achieved after repetition of the edge correction and optical intensity simulation a predetermined number of times, only the edges D are corrected assuming that these edges are the only target edges. If convergence is still not achieved, only the edges C are corrected assuming that these edges are the only target edges. This ensures that simulation is performed on all edges until a predetermined number of times is reached. For the correction performed beyond a predetermined number of times, the edges D and C are alternately corrected, followed by simulation.

Figure 4:
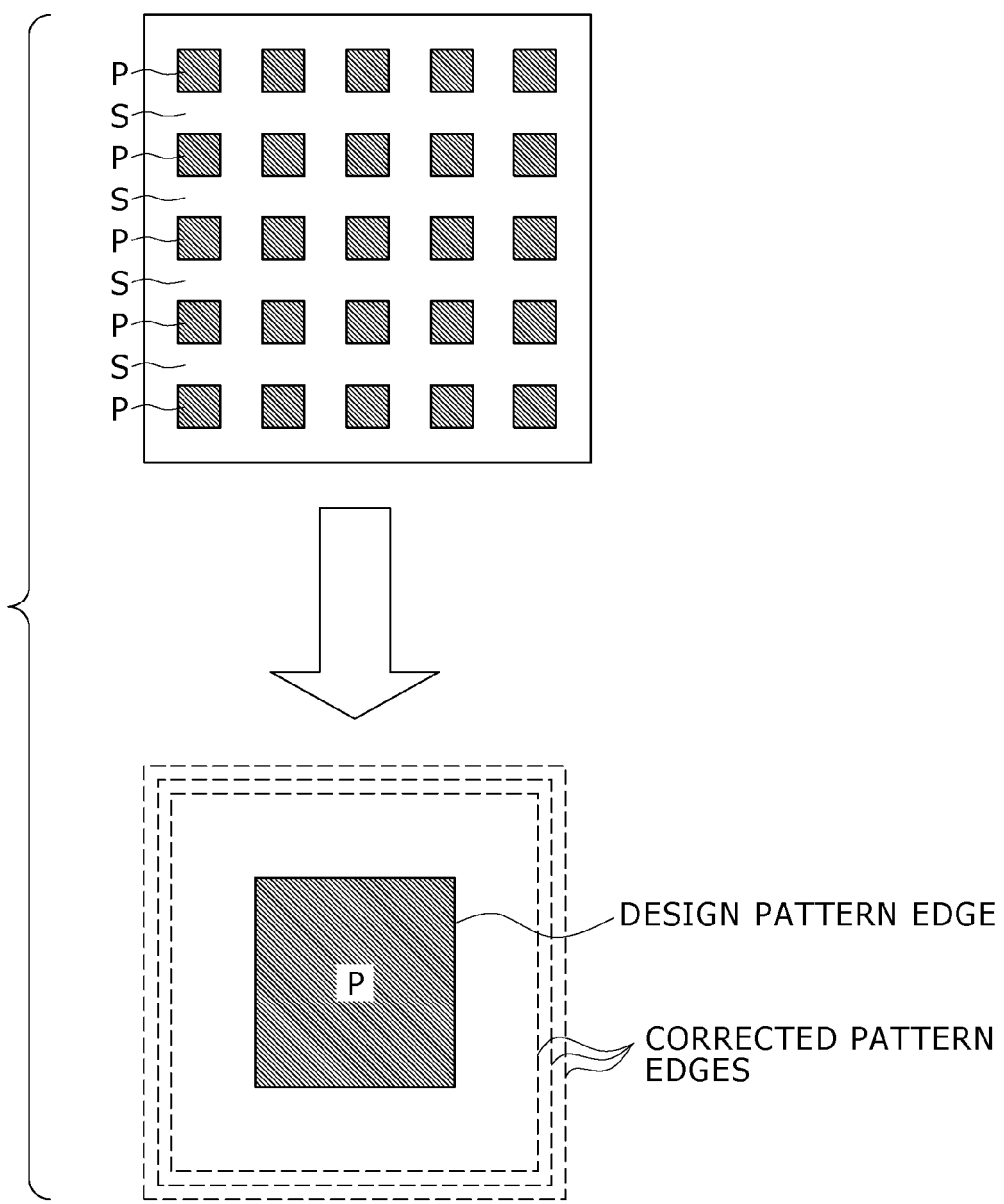
FIG. 4 is a schematic diagram describing edge correction for a specific pattern.

FIG. 4 is a schematic diagram describing edge correction for a specific pattern. In this example, the square pattern P adapted to form a contact hole is shown. If the pattern P is subjected to optical intensity simulation, as is, without any change to the design pattern, the contact hole to be transferred is smaller. Therefore, the pattern edges are positively biased by correction. A plurality of dashed lines in the bottom figure of FIG. 4 represent respective corrected pattern edges at each correction.

Here, an example of simulation calculation results is illustrated in FIGS. 5A and 5B when the edge width in the initial design pattern is 90 nm. Each of the tables in FIGS. 5A and 5B shows, for each correction count, the pattern width after correction (X and Y directions) and the EPE (X and Y directions) which is simulation calculation results. It should be noted that the EPE convergence condition is ±1 nm in this example.

FIG. 5A illustrates simulation results of the correction method in the past in which all edges are assumed to be target edges to be corrected. In this example, the dimensional difference between the simulated shape and the design pattern is alternately positive and negative, causing non-convergence of the calculations.

In contrast, FIG. 5B illustrates simulation results of the present embodiment. The present embodiment alternately assumes the previously classified edges C and D to be target edges to be corrected from the eighth correction and beyond. As a result, the EPE or dimensional difference between the simulated shape and the design pattern converges to less than 1 nm at the eighth correction.

Further, for a pattern having an identified spacing as in the case of a DRAM (Dynamic Random Access Memory), it is possible to derive, in advance, a value comparable to the correction amount which satisfies the convergence condition. By adding this derived value prior to correction, the EPE will converge with a fewer number of corrections than normal (e.g., random logic). For example, by adding the correction amount equivalent to four normal corrections prior to correction, both the edges C and D are alternatively corrected from the first correction. As a result, the convergence condition is fulfilled at the sixth correction.

As described above, the present embodiment allows for positive convergence of simulation calculations which was previously very difficult with the method in the past, thus ensuring improved accuracy in edge correction.

Figure 6A:
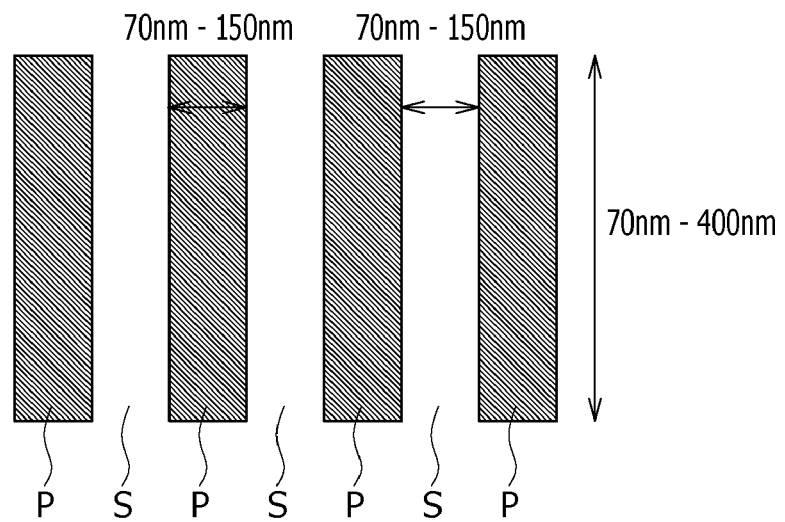
FIGS. 6A and 6B are schematic diagrams describing edge correction for a line-like pattern.

It should be noted that the present embodiment can also classify edges of the line-like pattern P illustrated in FIG. 6A for simulation as with the contact hole pattern. That is, the pattern width and pattern-to-pattern spacing are measured prior to optical intensity simulation. This is followed by extraction of a densely packed line-like pattern having, for example, a pattern width of 70 nm to 150 nm, which is comparable to the minimum line width, a pattern length of 70 nm to 400 nm and an edge-to-edge spacing of 70 nm to 150 nm.

Figure 6B:
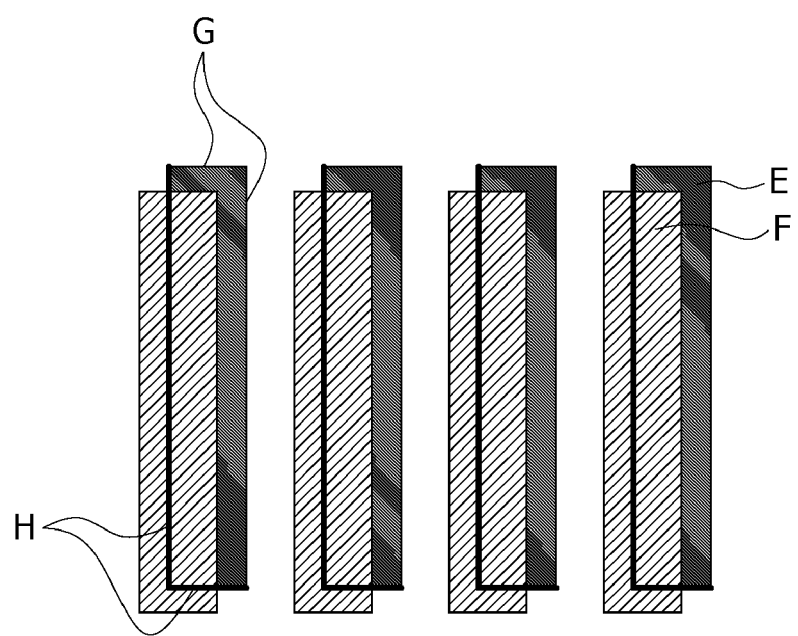

Then, as illustrated in FIG. 6B, an identically shaped pattern is prepared as a layer F. The X and Y coordinates of the layer F are moved respectively by 1 nm in a negative direction to such an extent that the layer F does not touch the adjacent pattern, so that the edges of a layer E are classified into edges H in contact with the layer F and edges G not in contact therewith.

Then, an initial correction amount is set as with the contact hole to proceed with the correction according to the OPC correction flowchart illustrated in FIG. 2. When the correction of all edges is completed a predetermined number of times (e.g., 5 times), the dimensional difference between the simulated shape near the line end and the design pattern is alternately positive and negative from the sixth correction and beyond, causing non-convergence. In this case, therefore, the previously classified edges H and G are alternately corrected as target edges at the sixth correction. This brings the dimensional difference between the simulated shape and the design pattern down to less than 1 nm, thus providing convergence.

FIG. 7 is a flowchart describing another embodiment. In the example described earlier, the pattern width and pattern-to-pattern spacing are measured from the design data of the target pattern. Then, the densely packed pattern is extracted for classification of edges in advance. The example in FIG. 7 differs therefrom in that the edges are classified later.

First, the target design pattern data is input from a database or other source (step S21), followed by addition of an initial correction amount (step S22).

The correction amount is calculated by EPE×a, where a=−60% for the first correction, a=−40% for the second correction, a=−40% for the third correction, a=−40% for the fourth correction, and a=−10% for the fifth correction and beyond. Further, the design pattern is positively biased by approximately 40% of the minimum line width (e.g., 30 nm) as an initial correction value. It should be noted that these values are merely examples, and the present invention is not limited thereto.

Next, based on the above correction amount, optical intensity simulation is performed (step S23). This simulation produces, as an EPE output, the difference between the calculated dimension of the pattern transferred by exposure under predetermined conditions using a mask with a pattern to be corrected formed thereon and the design pattern dimension.

Then, it is determined whether the EPE of the target pattern edge satisfies the convergence condition (step S24). If so, the correction is assumed to be complete, and the edge is removed from the list of edges to be corrected for the next correction (step S25).

If not, it is determined whether the correction has been made a predetermined number of times (6 times in this case) or more (step S26). If not, the above correction amount is added to the edge (step S27). The correction amount is EPE×a as described above, with 'a' being a ratio set for each number of corrections performed.

If the edge EPE does not satisfy the convergence condition, the correction and optical intensity simulation are repeated. If, after a predetermined number of corrections, the EPE fails to satisfy the convergence condition, it is determined whether the edges have been classified (step S28).

Then, if the edges have yet to be classified, they will be done so (step S29). This classification of edges is performed in the same manner as with that in the flowchart of FIG. 1.

After the edge classification, it is determined whether the edges D are the only edges to be corrected at present (step S30). If the edges to be corrected include not only edges D, it is assumed that the edges D are the only edges to be corrected (step S31). Then, the correction amount is added only to the edges D, followed by optical intensity simulation. On the other hand, when the edges to be corrected include only the edges D, it is assumed that the edges C are the only edges to be corrected (step S32). Then, the correction amount is added only to the edges C, followed by optical intensity simulation.

That is, if convergence is not achieved after repetition of the edge correction and optical intensity simulation a predetermined number of times, after the edge classification, only the edges D are corrected assuming that these edges are the only target edges. If convergence is still not achieved, only the edges C are corrected assuming that these edges are the only target edges. This ensures that simulation is performed on all edges until a predetermined number of times is reached. For the correction performed beyond a predetermined number of times, the edges D and C are alternately corrected, followed by simulation.

As described above, the present embodiment allows for positive convergence of simulation calculations which was previously very difficult with the method in the past, thus ensuring improved accuracy in edge correction.

Figure 8:
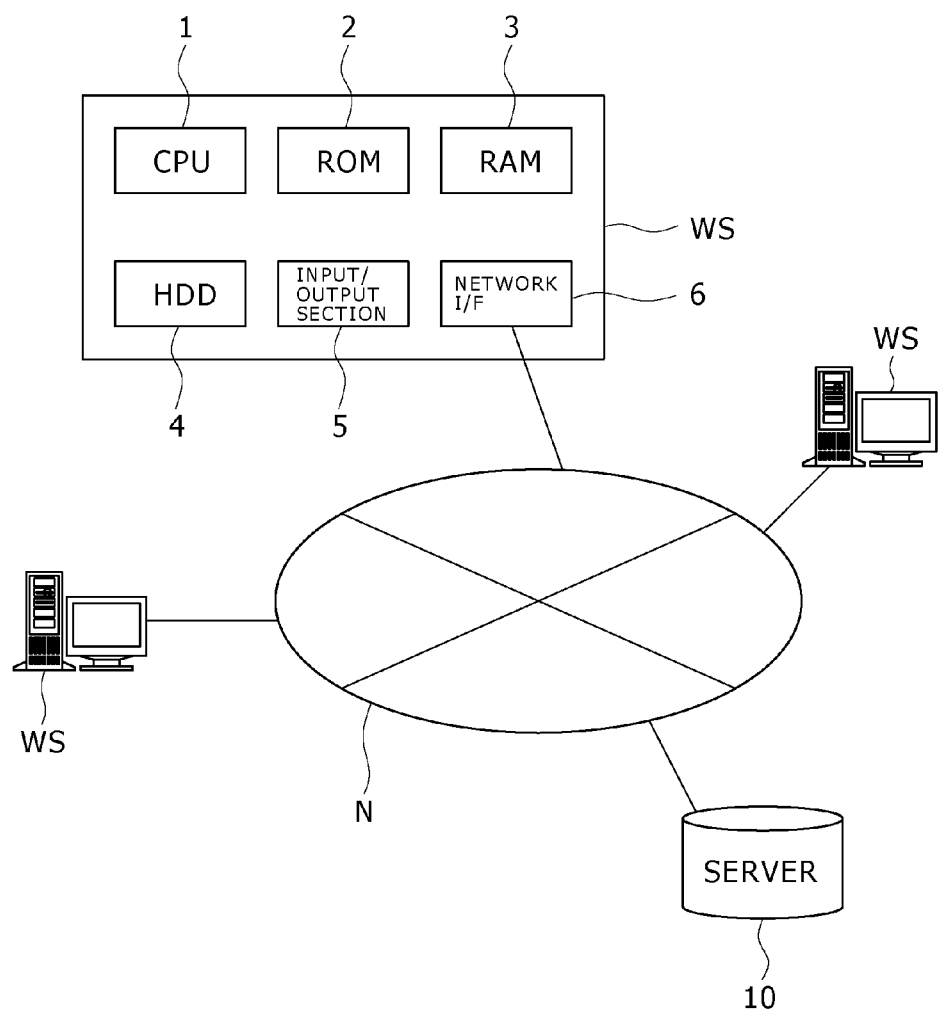
FIG. 8 is a schematic diagram describing the configuration of a mask pattern correction system.

FIG. 8 is a schematic diagram describing the configuration of a system (mask pattern correction system) to which the mask pattern correction program of the present embodiment is applied. The system includes a workstation WS or other type of computer.

The workstation WS includes a CPU (arithmetic means) 1, a ROM (Read Only Memory) 2, a RAM (Random Access Memory) 3, an HDD (Hard Disk Drive) 4, an input/output section 5 and a network I/F (interface) 6. The workstation WS connects to a server 10 via a network N.

The mask pattern correction program of the present embodiment is stored in the HDD 4 of the workstation WS. The program is read into the RAM 3 for execution by the CPU 1. On the other hand, the mask pattern design data is stored in the HDD 4 or the server 10. When input as data using the mask pattern correction program, the design data is read from the HDD 4 or the server 10 via the network N.

In the system configured as described above, all steps may be performed by the single workstation WS. Alternatively, some of the steps may be performed by the other workstation WS via the network N so that the results appear on the display of the input/output section 5.

It should be understood by those skilled in the art that various modifications, combinations, sub-combinations and alternations may occur depending on design requirements and other factors insofar as they are within the scope of the appended claims or the equivalent thereof.

What is claimed is:

1. A non-transitory computer-readable storage medium comprising a mask pattern correction program for correcting a design pattern which serves as a source to form a mask pattern so that, by exposure of a mask with a pattern formed thereon onto a substrate, the mask pattern is transferred as designed, the mask pattern correction program, when executed by a computer, causes the computer to perform; the steps of:
    determining, before simulation of a dimension of the pattern transferred by exposure, whether a simulation result will converge; and
    classifying design pattern edges into first and second target edges, correct the first target edges and perform simulation thereon if it is determined that the simulation result will not converge.

2. The computer-readable storage medium of claim 1, wherein in the mask pattern correction program
    it is determined that the simulation result will not converge if a spacing between each of the edges of the design pattern and the edge of an adjacent pattern or an edge-to-edge spacing in the design pattern is smaller than a given spacing.

3. The computer-readable storage medium of claim 1, wherein in the mask pattern correction program
    it is determined that the simulation result will not converge if a difference between the transferred pattern and design value does not fall within a given range when correction of the design pattern by a given amount followed by the simulation using the design pattern is repeated a predetermined number of times.

4. The computer-readable storage medium of claim 1, wherein in the mask pattern correction program
    the edges are classified into the first and second target edges by moving the design pattern slightly in X and Y directions of a design coordinate and determining whether edges of the design pattern and those of another design pattern intersect with each other.

5. The computer-readable storage medium of claim 1, wherein in the mask pattern correction program
    when a difference between the transferred pattern and design value falls within a given range after the correction and simulation of the first target edges, the second target edges are subjected to the correction followed by the simulation using the design pattern.

6. A mask pattern correction system for correcting a design pattern which serves as a source to form a mask pattern so that, by exposure of a mask with a pattern formed thereon onto a substrate, the mask pattern is transferred as designed, the mask pattern correction system comprising performing, using arithmetic means, the steps of:
    determining, before simulation of a dimension of the pattern transferred by exposure, whether a simulation result will converge; and
    classifying design pattern edges into first and second target edges, correct the first target edges and perform simulation thereon if it is determined that the simulation result will not converge.

* * * * *